US006756248B2

(12) United States Patent
Ikeda et al.

(10) Patent No.: US 6,756,248 B2
(45) Date of Patent: Jun. 29, 2004

(54) PRESSURE TRANSDUCER AND MANUFACTURING METHOD THEREOF

(75) Inventors: Masaharu Ikeda, Yokohama (JP); Masayoshi Esashi, Sendai (JP)

(73) Assignee: Matsushita Electric Industrial Co., Ltd. (JP)

( * ) Notice: Subject to any disclaimer, the term of this patent is extended or adjusted under 35 U.S.C. 154(b) by 102 days.

(21) Appl. No.: 10/082,318

(22) Filed: Feb. 26, 2002

(65) Prior Publication Data

US 2002/0093038 A1 Jul. 18, 2002

Related U.S. Application Data

(62) Division of application No. 09/342,065, filed on Jun. 29, 1999, now Pat. No. 6,441,451.

(30) Foreign Application Priority Data

Jun. 30, 1998 (JP) .......................................... 10-198078

(51) Int. Cl.[7] ......................... H01L 21/00; H01L 29/82; H01L 7/08

(52) U.S. Cl. ............................. 438/53; 438/50; 438/51; 438/52; 257/417; 257/418; 257/419; 257/420; 73/715; 73/718

(58) Field of Search ................................. 257/416, 417, 257/418, 419, 420; 438/50, 51, 52, 53, 743, 756; 73/715, 718, 721–728

(56) References Cited

U.S. PATENT DOCUMENTS

| | | | | |
|---|---|---|---|---|
| 4,467,656 A | | 8/1984 | Mallon et al. | |
| 5,177,579 A | | 1/1993 | Jerman | |
| 5,357,807 A | * | 10/1994 | Guckel et al. | 73/721 |
| 5,616,514 A | | 4/1997 | Muchow et al. | |
| 6,472,244 B1 | * | 10/2002 | Ferrari et al. | 438/53 |

FOREIGN PATENT DOCUMENTS

| | | | |
|---|---|---|---|
| JP | 09257618 A | | 10/1997 |
| JP | 409257618 A | * | 10/1997 |

OTHER PUBLICATIONS

S>Wolf, Silicon Processing for the VLSI Era, vol. 1, pp564.*

* cited by examiner

*Primary Examiner*—Donghee Kang
(74) *Attorney, Agent, or Firm*—Connolly, Bove, Lodge & Hutz

(57) ABSTRACT

A pressure transducer designed to transform static pressure or dynamic pressure applied to a diaphragm into a corresponding electrical signal and a method of manufacturing the same are provided. The transducer includes a fixed electrode formed in an upper surface of a substrate and a moving electrode provided in the diaphragm disposed above the fixed electrode through a cavity. The substrate has formed in the bottom thereof at least one hole which is used in a manufacturing process for removing a sacrificial layer formed between the diaphragm and the upper surface of the substrate in dry etching to form the cavity.

17 Claims, 8 Drawing Sheets

PRESSURE TRANSDUCER AND MANUFACTURING METHOD THEREOF

This application is a divisional of U.S. Ser. No. 09/342,065, filed Jun. 29, 1999, now U.S. Pat. No. 6,441,451, issued Aug. 27, 2002.

BACKGROUND OF THE INVENTION

1. Technical Field of the Invention

The present invention relates generally to a pressure transducer such as a microphone designed to transform static pressure or dynamic pressure (e.g., acoustic vibration) into a corresponding electrical signal and a method of manufacturing the same.

2. Background Art

Japanese Patent Application No. 9-257618 teaches an electro-static capacitance type pressure sensor designed to convert the static or dynamic pressure into corresponding electrical signals. FIG. 7(*h*) shows this pressure sensor. FIGS. 7(*a*) to 7(*g*) show a sequence of manufacturing processes.

First, the substrate 30 is made of a monocrystalline silicon material. Impurities are diffused into a major outer surface of the substrate 30 to form the fixed electrode 40, the fixed electrode lead 41, and the lower fixed electrode terminal 42. Next, the first insulating layer 50, as shown in FIG. 7(*a*), is formed over the major outer surface of the substrate 30. On the first insulating layer 50, the sacrificial layer 60, as shown in FIG. 7(*b*), which is to be removed in a later process is formed.

The first insulating diaphragm layer 70, as shown in FIG. 7(*c*), is formed over the sacrificial layer 60. The second conductive layer 80 is formed on the first insulating diaphragm layer 70. Preselected portions of the second conductive layer 80 are removed to form the moving electrode 81, the moving electrode lead 82, and the lower moving electrode terminal 83.

Subsequently, the second insulating diaphragm layer 90, as shown in FIG. 7(*d*), is formed. A plurality of holes 91 are formed which extend to the sacrificial layer 60 through peripheral portions of the first and second insulating diaphragm layers 70 and 90. The holes 91 are used as etchant inlets.

Etching liquid is injected through the holes 91 to etch the sacrificial layer 60 isotropically to remove it, as shown in FIG. 7(*e*), thereby forming the reference pressure chamber 96 between the first insulating layer 50 and the first insulating diaphragm layer 70. The moving electrode connecting hole 92 and the fixed electrode connecting hole 94 are formed. The moving electrode connecting hole 92 extends to the lower moving electrode terminal 83 through the second insulating diaphragm layer 90. The fixed electrode connecting hole 94 extends to the lower fixed electrode terminal 42 through the second insulating diaphragm layer 90, the first insulating diaphragm layer 70, and the first insulating layer 50.

A conductive layer is formed on the second insulating diaphragm layer 90, after which preselected portions of the conductive layer are removed to form, as shown in FIG. 7(*f*), the moving electrode output terminal 93 and the fixed electrode output terminal 95. The moving electrode output terminal 93 connects with the lower moving electrode terminal 83 through the moving electrode connecting hole 92. The fixed electrode output terminal 95 connects with the lower fixed electrode terminal 42 through the fixed electrode connecting hole 94.

A sealing layer is formed on the second insulating diaphragm layer 90 to seal the holes 91 and then removed, as shown in FIG. 7(*g*), leaving portions around the holes 91 as sealing caps 97.

In operation, when the pressure is applied, it will cause a diaphragm consisting of the first and second insulating diaphragm layers 70 and 90 to be deformed. Specifically, both the pressure in the reference pressure chamber 96 and the surrounding pressure act on the diaphragm in opposite directions, so that the diaphragm is deformed by an amount equivalent to a difference between those pressures. This will cause the capacitance of a capacitor consisting of the moving electrode 81 formed on the diaphragm and the fixed electrode 41 to change as a function of the deformation of the diaphragm. The difference between the pressure in the reference pressure chamber 96 and the surrounding pressure acting on the diaphragm is, thus, determined by measuring the value of the capacitance. The measurement of absolute pressure may be accomplished by decreasing the pressure in the reference pressure chamber 96 to a level much lower than a pressure measurable range of the pressure sensor.

The above conventional pressure sensor, however, has the following drawbacks. When the etching liquid used to etch the sacrificial layer 60 and the cleaning solvent therefor are dried, the surface tension of the liquid may cause damage to the diaphragm. The avoidance of this problem requires an additional process of replacing the etching liquid and the cleaning solvent with liquid whose surface tension is smaller before drying them or of drying the etching liquid and the cleaning solvent using a gas liquefied by pressurizing and cooling it.

The formation of the holes 91 for feeding the etching liquid may cause the diaphragm to change in mass and compromise the mechanical strength. In order to minimize this problem, the holes 91 may be formed in the periphery of the diaphragm, however, the drawback is encountered in that it takes much time to etch a central portion of the diaphragm distant from the holes 91.

In a case where many pressure sensors are formed on a single substrate and separated using a dicing saw in mass production, the water used in the dicing will penetrate into cavities of the substrate, which may cause the pressure sensors to be broken when dried.

SUMMARY OF THE INVENTION

It is therefore a principal object of the present invention to avoid the disadvantages of the prior art.

It is another object of the present invention to provide a pressure transducer having the structure which allows the pressure transducer to be formed easily without damage to component parts such as a diaphragm etc.

According to one aspect of the invention, there is provided a pressure transducer designed to transform an applied pressure into a corresponding electrical signal. The pressure transducer comprises: (a) a substrate having a first surface and a second surface opposed to the first surface; (b) a fixed electrode formed in the first surface of the substrate; (c) a diaphragm attached at a peripheral portion thereof to the first surface of the substrate so as to form a cavity between a central portion thereof and the fixed electrode, the diaphragm having a moving electrode opposed to the fixed electrode through the cavity and being deformed in response to an applied pressure to change a distance between the moving electrode and the fixed electrode as a function of the applied pressure; and (d) a hole formed in the substrate which extends from the second surface to the cavity.

In the preferred mode of the invention, holes are further formed in the substrate which extend from the second surface to the cavity and which are so arranged that adjacent two of all of the holes are disposed at a regular interval away from each other.

The diaphragm is corrugated. Specifically, the diaphragm has a plurality of waved portions formed coaxially.

A groove is formed in the first surface of the substrate within the cavity and which leads to the holes.

A diaphragm support member is disposed within the cavity in contact with an inner wall of the peripheral portion of the diaphragm.

The substrate may be made of a semiconductor substrate having integrated circuit elements which form a detector designed to measure a capacitance between the fixed and moving electrodes.

The diaphragm may be made of an inorganic material such as a compound of silicon and one of oxygen and nitrogen.

The diaphragm may have a wave formed on the peripheral portion thereof. The wave projects to the first surface of the substrate to increase adhesion of the diaphragm to the first surface of the substrate. The wave may be formed by forming a groove in the first surface of the substrate so that the peripheral portion of said diaphragm partially projects to the groove.

According to the second aspect of the invention, there is provided a method of manufacturing a pressure transducer which comprises the steps of: (a) preparing a substrate having a first surface and a second surface opposed to the first surface; (b) forming a fixed electrode in the first surface of the substrate; (c) forming a sacrificial layer over the fixed electrode; (d) forming a diaphragm layer made of an insulating material over the sacrificial layer; (e) forming a hole which extends from the second surface of the substrate to the sacrificial layer; and (f) injecting gasses into the hole to remove the sacrificial layer in dry etching to form a cavity so that the diaphragm layer is deformed in response to an applied pressure.

In the preferred mode of the invention, the step of forming at least one waved portion on the first surface of the substrate may further be provided.

The waved portion may alternatively be formed on a surface of the sacrificial layer.

The substrate is made of a semiconductor substrate having integrated circuit elements which form a detector designed to measure a capacitance between the fixed and moving electrodes.

The diaphragm is made of an inorganic material, and the sacrificial layer is made of an organic material.

The diaphragm may be made from a compound of silicon and one of oxygen and nitrogen.

The sacrificial layer may be made of polyimide.

The removal of the sacrificial layer is achieved in the dry etching using oxygen plasma.

The gas injecting step removes the sacrificial layer so as to leave a peripheral portion of the sacrificial layer.

According to the third aspect of the invention, there is provided a method of manufacturing a pressure transducer which comprises the steps of: (a) preparing a substrate having a first surface and a second surface opposed to the first surface; (b) forming a fixed electrode in the first surface of the substrate; (c) forming an insulating layer over the fixed electrode; (d) forming a sacrificial layer on the insulating layer; (e) forming a diaphragm layer made of a conductive material over the sacrificial layer; (f) forming a hole which extends from the second surface of the substrate to the sacrificial layer; and (g) injecting gasses into the hole to remove the sacrificial layer in dry etching to form a cavity so that the diaphragm layer is deformed in response to an applied pressure.

In the preferred mode of the invention, the step of forming at least one waved portion on the first surface of the substrate is further provided.

The waved portion may alternatively formed on a surface of the sacrificial layer.

The substrate is made of a semiconductor substrate having integrated circuit elements which form a detector designed to measure a capacitance between the fixed and moving electrodes.

The diaphragm is made of an inorganic material, and the sacrificial layer is made of an organic material.

The diaphragm may be made form a compound of silicon and one of oxygen and nitrogen.

The sacrificial layer is made of polyimide.

The removal of the sacrificial layer is achieved in the dry etching using oxygen plasma.

The gas injecting step removes the sacrificial layer so as to leave a peripheral portion of the sacrificial layer.

According to the fourth aspect of the invention, there is provided a method of manufacturing a plurality of pressure transducers using a signal substrate which comprises the steps of: (a) preparing a single substrate having a first surface and a second surface opposed to the first surface; (b) forming fixed electrodes in the first surface of the substrate; (c) forming a sacrificial layer on each of the fixed electrode; (d) forming a diaphragm layer made of an insulating material over each of the sacrificial layer; (e) forming a hole which extends from the second surface of the substrate to each of the sacrificial layer; (f) forming a cutting groove between adjacent two of the pressure transducers for separating the pressure transducers from each other; and (g) injecting gasses into the hole to remove the sacrificial layer in dry etching to form a cavity so that the diaphragm layer is deformed in response to an applied pressure.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings:

FIG. 1(*h*) is a plan view which shows a pressure sensor of the first embodiment;

FIG. 2(*h*) is a plan view which shows a pressure sensor of the second embodiment;

FIG. 3(*h*) is a plan view which shows a pressure sensor of the third embodiment;

FIG. 4(*h*) is a plan view which shows a pressure sensor of the fourth embodiment;

FIG. 5(*h*) is a plan view which shows a pressure sensor of the fifth embodiment;

FIG. 6(*h*) is a plan view which shows the pressure sensor produced in the processes illustrated in FIGS. 6(*a*), 6(*b*), 6(*c*), 6(*d*), 6(*e*), 6(*f*), and 6(*g*);

FIG. 7(*h*) is a plan view which shows a conventional pressure sensor produced in the processes illustrated in FIGS. 7(*a*), 7(*b*), 7(*c*), 7(*d*), 7(*e*), 7(*f*), and 7(*g*).

DESCRIPTION OF THE PREFERRED EMBODIMENTS

Figure 1A:
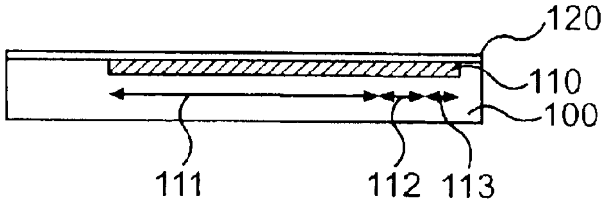
FIGS. 1(*a*), 1(*b*), 1(*c*), 1(*d*), 1(*e*), 1(*f*), and 1(*g*) are cross sectional view taken along the line A—A in FIG. 1(*h*) which show a sequence of manufacturing processes for a pressure sensor according to the first embodiment of the invention.
Figure 1B:
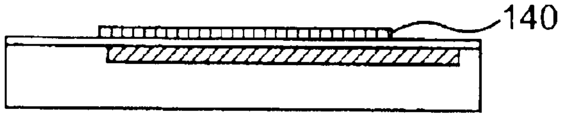
Figure 1C:
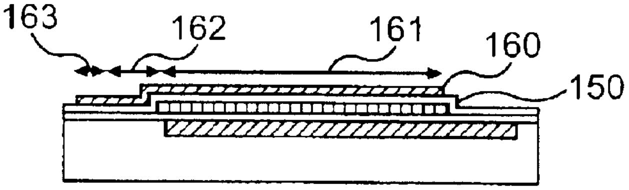
Figure 1D:
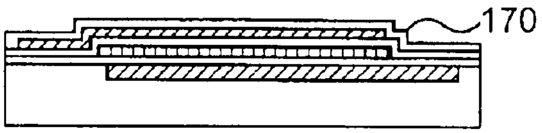
Figure 1E:
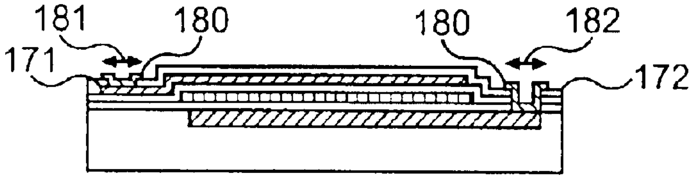
Figure 1F:
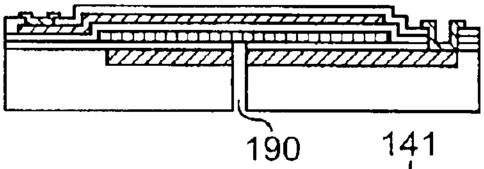
Figure 1G:
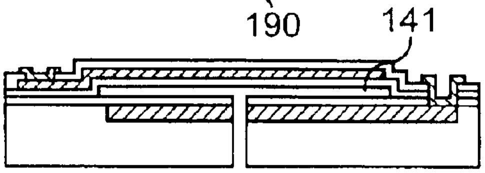
Figure 1H:
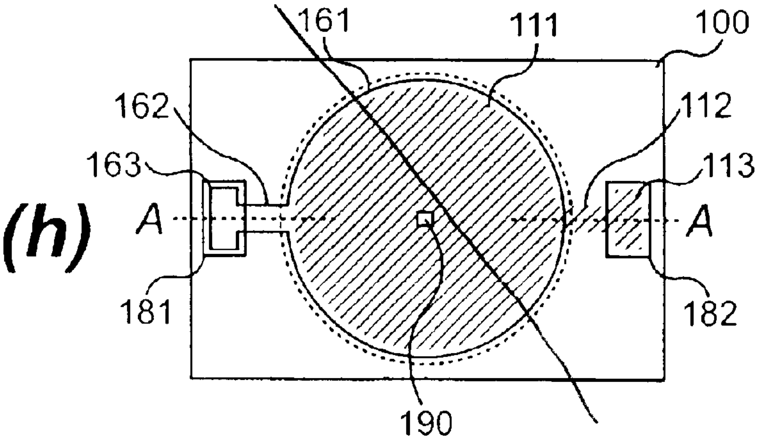
Figure 1H:
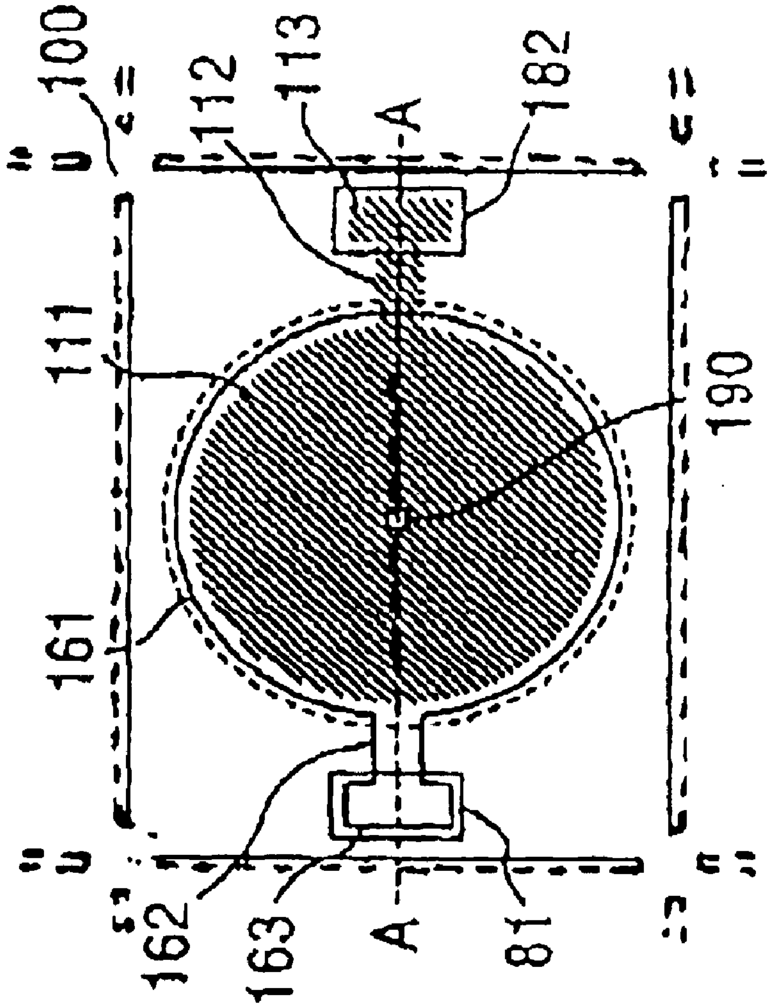

Referring now to the drawings, wherein like numbers refer to like parts in several views, particularly to FIG. 1(*h*), there is shown a pressure sensor according to the first embodiment of the present invention. FIGS. 1(*a*) to 1(*g*) show a sequence of manufacturing processes.

The pressure sensor is designed to transform static pressure or dynamic pressure applied to a diaphragm into a corresponding electrical signal and includes the substrate 100 made of a monocrystalline silicon material, the cavity 141, the first conductive layer 110 having the electric conductivity produced by diffusing impurities into the substrate 100, the fixed electrode 111 formed with a portion of the first conductive layer 110, the first insulating layer 120, the moving electrode 161 formed with a portion of the second conductive layer 160, and the hole 190.

The pressure sensor also includes the first diaphragm layer 150, the second diaphragm layer 170, and the second conductive layer 160. The first diaphragm layer 150 is made of an insulating material and formed over the cavity 141. The second conductive layer 160 is formed on the first diaphragm layer 150. The second diaphragm layer 170 is made of an insulating material and formed on the second conductive layer 160. The first and second diaphragm layers 150 and 170 and the second conductive layer 160 constitute a diaphragm.

The fixed electrode 111 leads to the fixed electrode output terminal 182 through the fixed electrode lead 112, the lower fixed electrode terminal 113, and the fixed electrode connecting hole 172. The fixed electrode output terminal 182 is formed with a portion of the third conductive layer 180. The fixed electrode lead 112 and the lower fixed electrode terminal 113 are both formed with abutting portions of the first conductive layer 110. The fixed electrode connecting hole 172 is formed on the lower fixed electrode terminal 113.

The moving electrode 161 leads to the moving electrode output terminal 181 through the moving electrode lead 162, the lower moving electrode terminal 163, and the moving electrode connecting hole 171. The moving electrode output terminal 181 is formed with a portion of the third conductive layer 180. The moving electrode lead 162 and the lower moving electrode terminal 163 are both formed with abutting portions of the second conductive layer 160. The moving electrode connecting hole 171 is formed on the lower moving electrode terminal 163.

In manufacturing the above described pressure sensor, the fixed electrode 111, the fixed electrode lead 112, and the lower fixed electrode terminal 113 are, as shown in FIG. 1(*a*), first formed by diffusing impurities into a preselected area of an upper surface of the monocrystalline silicon substrate 100, as viewed in the drawing, after which the first insulating layer 120 made of silicon oxide is formed on the whole of the upper surface of the substrate 100.

An organic layer made of, for example, polyimide is, as shown in FIG. 1(*b*), formed on the whole of the first insulating layer 120, after which the periphery of the organic layer is removed to form the circular sacrificial layer 140 used in forming the cavity 141 in a later process.

The first diaphragm layer 150 made of silicon nitride is, as shown in FIG. 1(*c*), formed over the upper surface of the substrate 100. The second conductive layer 160 made of chrome is formed on the first diaphragm layer 150. Preselected portions of the second conductive layer 160 are removed to form the moving electrode 161, the lower moving electrode terminal 163, and the moving electrode lead 162 connecting the moving electrode 161 with the lower moving electrode terminal 163.

Subsequently, the second diaphragm layer 170 made of silicon nitride is, as shown in FIG. 1(*d*), formed over the upper surface of the substrate 100.

Holes are, as shown in FIG. 1(*e*), formed which extend to the lower fixed electrode terminal 113 and the lower moving electrode terminal 163 through the second diaphragm layer 170. The third conductive layer 180 is formed over the second diaphragm layer 170, after which preselected portions of the third conductive layer 180 are removed to form the moving electrode output terminal 181 and the fixed electrode output terminal 182. The moving electrode output terminal 181 connects with the lower moving electrode terminal 163 through the moving electrode connecting hole 171. The fixed electrode output terminal 182 connects with the lower fixed electrode terminal 113 through the fixed electrode connecting hole 172.

The through hole 190 is, as shown in FIG. 1(*f*), formed in the center of the bottom of the substrate 100 which extends vertically, as viewed in the drawing, to the sacrificial layer 140 through the first conductive layer 110 and the first insulating layer 120. The formation of the hole 190 is accomplished by removing the silicon of the bottom of the substrate 100 using gases whose main component is sulfur hexafluoride ($SF_6$) excited by plasma, after which the silicon oxide of a central portion of the first insulating layer 120 is removed using chemical liquid such as hydrofluoric acid.

The sacrificial layer 140 is removed, as shown in FIG. 1(*g*), isotropically in the dry etching by injecting gasses whose main component is oxygen excited by plasma into the hole 190, thereby forming the cavity 141 between the first insulating layer 120 and the first diaphragm layer 150.

The materials and forming methods used in the above processes will be discussed below in more detail.

The substrate 100 is made of a silicon wafer which is available easily as material used in forming semiconductor integrated circuits. The first conductive layer 110 includes a diffused portion on which a current path is formed by depositing impurities such as phosphorus and boric acid on a preselected area on the first conductive layer 110 through a mask and subjecting the first conductive layer 110 to a heat treatment to increase the impurity concentration per cubic centimeter up to $10^{18}$ to $10^{20}$ for increasing the electric conductivity of the preselected area. The first insulating layer 120 is formed by thermal oxidation or using a plasma CVD device at low temperature. The second conductive layer 160 and the third conductive layer 180 are formed by forming a metallic layer made of chrome or aluminum using evaporation or sputtering techniques and removing unmasked portions using etching reagent.

The sacrificial layer 140 is made of an organic material which is easy to remove in dry etching and which withstands the ambient temperature in the subsequent processes of forming the first and second diaphragm layers 150 and 170 (e.g., plasma CVD processes). In this embodiment, the sacrificial layer 140 is made of polyimide. The formation of the sacrificial layer 140 is achieved by forming a film with a polyimide precursor in spin coating, etching the film using a resist mask and a chemical liquid, and subjecting it to a heat treatment for polymerization or polymerizing the film early and finishing it into a desired shape using a metallic mask in the dry etching or the wet etching with a strong alkaline liquid.

The formation of the through hole 190 in the substrate 100 is accomplished in the dry etching using gasses whose main component is sulfur hexafluoride ($SF_6$) excited by plasma and a metallic mask or a silicon oxide mask.

The measurements of the pressure sensor in this embodiment are as follows. The diameter and thickness of the cavity 141 are 1800 μm and 5 μm, respectively. The diameter of the through hole 190 is 100 μm. The thickness of the diaphragm including the first and the second diaphragm layers 150 and 170 and the second conductive layer 160 is 2 μm.

In operation, when the pressure is applied to the outer surface of the diaphragm, it will cause the diaphragm to be deformed inwardly. The degree of deformation of the diaphragm depends upon a difference between the pressure in the cavity 141 acting on the inner surface of the first diaphragm layer 150 and the surrounding pressure acting on the outer surface of the second diaphragm layer 170. This will cause the capacitance of a capacitor consisting of the moving electrode 161 formed in the second conductive layer 160 and the fixed electrode 111 to change as a function of the deformation of the diaphragm. The difference between the pressure in the cavity 141 acting on the back surface of the diaphragm and the pressure acting on the outer surface of the diaphragm is, thus, determined by measuring the value of the capacitance. The measurement of absolute pressure may be accomplished by keeping the pressure in the cavity 141 at a level much lower than a pressure measurable range of the pressure sensor. For example, it may be achieved by placing the whole of the pressure sensor under a lower pressure and sealing the hole 190.

As apparent from the above discussion, the method of producing the pressure sensor in this embodiment allows the sacrificial layer 140 to be removed without use of any chemical liquid, thereby avoiding breakage or deformation of the diaphragm caused by the surface tension of the liquid created when dried.

Usually, a plurality of sensors are formed on a single substrate in a matrix arrangement and separated using a dicing saw for convenience and economy of production. This, however, gives rise to a problem of breakage or deformation of the diaphragm caused by the surface tension of the water used in the dicing created when dried In order to avoid this problem, this embodiment cuts a plurality of pressure sensors formed on a single substrate from each other in the following manner without use of the liquid such as cooling water.

It is assumed that the same pressure sensors are formed on the substrate 100 in a matrix arrangement. In the process shown in FIG. 1(*f*), a cutting groove is etched into the bottom of the substrate 100 between adjacent two of the pressure sensors using a mask at the same time as the hole 190 is formed. After the process in FIG. 1(*g*), an additional process is provided to apply mechanical pressure to the substrate 100 to crack the cutting groove, thereby separating the pressure sensors from each other.

The fixed electrode 111, the fixed electrode lead 112, and the lower fixed electrode terminal 113 are, as described above, formed with the first conductive layer 110 provided on the substrate 100 whose dopant dose is relatively low. Use of a heavily doped substrate, however, permits the fixed electrode 111, the fixed electrode lead 112, and the lower fixed electrode terminal 113 to be formed directly on the substrate without forming the first conductive layer 110. In this case, however, the parasitic capacity of the fixed electrode 111 is increased by an increase in area of a parasitic device, i.e., a conductive portion of the substrate 100 other than the fixed electrode 111. If the fixed electrode 111 is provided at an end of a capacitance-measuring circuit which has a high impedance, it will result in a decrease in gain of the transducer (i.e., the pressure sensor). This may, however, be avoided by providing the moving electrode 161 at the end of the capacitance-measuring circuit which has a high impedance. In this case, the high impedance appears near the outer surface of the pressure sensor, so that electric lines of force produced by objects surrounding the pressure sensor fall on the moving electrode 161, thereby causing unwanted noise signals to be detected, but this problem is eliminated by installation of a shield surrounding the pressure sensor.

The diaphragm of this embodiment, as described above, consists of the first and second diaphragm layers 150 and 170 and the second conductive layer 160 interposed between them. This structure offers advantages that the second conductive layer 160 is not exposed directly to the gasses whose pressure is being measured, and it is easy to adjust the stress and the coefficient of thermal expansion of the diaphragm. However, the diaphragm may alternatively be formed with the second conductive layer 160 and either of the first and second diaphragm layers 150 and 170. If the first diaphragm layer 150 is omitted, the first insulating layer 120 formed on the fixed electrode 111 serves to prevent the moving electrode 161 from being short-circuited to the fixed electrode 111.

The second diaphragm layer 170 is made of an insulating material, but may alternatively be made of a conductive material to have the same functions as those of the second conductive layer 160 and the third conductive layer 180. In this case, it is necessary to insulate the moving electrode output terminal 181 electrically from the fixed electrode output terminal 182.

The sacrificial layer 140 is removed completely in the dry etching isotropically in this embodiment, but may be left partially on an inner side wall of the cavity 141 to provide uniform mechanical strength to a support of the diaphragm along the circumference of the diaphragm so that the degree of deformation may be uniform over the whole of the diaphragm. This is easily accomplished by forming the through hole 190 in alignment with the center of the sacrificial layer 140 and controlling the time of the dry etching process.

The hole 190 is so formed as to penetrate through the center of the first insulating layer 120 in the process illustrated in FIG. 1(*f*), but such penetration of the first insulating layer 130 may be made at the same time as the first insulating layer 120 is formed in the process in FIG. 1(*a*).

The formation of the hole 190 is, as described above, accomplished by covering the center of the substance 100 with a metallic mask or a silicon oxide mask and etching it using gasses whose main component is sulfur hexafluoride ($SF_6$) excited by plasma. This etching has the directivity to form the hole 190 in a vertical direction, but another dry etching which can form the hole 190 isotropically may be used. Further, the wet etching which can form the hole 190 using a silicon nitride mask and a strong alkaline liquid or a mixture of hydrofluoric acid and nitric acid may be used. The use of the strong alkaline liquid will cause a (111) plane of a crystal lattice of silicon of the substrate 100 to be left. It is, thus, necessary for a (100) plane or a (110) plane to appear on the surface of the substrate 100 except when the mixture of hydrofluoric acid and nitric acid is used which enables the isotropic etching.

The use of the isotropic etching will cause the substrate 100 to be removed horizontally as well as vertically, thereby compromising the controllability of diameter of a portion of the hole 190 near the sacrificial layer 140 and thus is suitable for a case where the hole 190 has the diameter greater than the thickness of the substrate 100. In the crystal orientation etching, horizontal removal of the substrate 100 depends strongly upon the crystal orientation of silicon. Thus, if the crystal orientation of the substrate 100 is defined on a (100) plane, it will cause a plane extending at an angle of approximately 55° to the surface of the substrate 100 to be left, thus requiring a larger size of a mask to form the hole 190 having the same diameter as that when the hole 190 is formed in the isotropic etching. This means that crystal orientation etching is not suitable for following embodiments wherein a plurality of through holes are formed in a substrate.

Figure 2A:
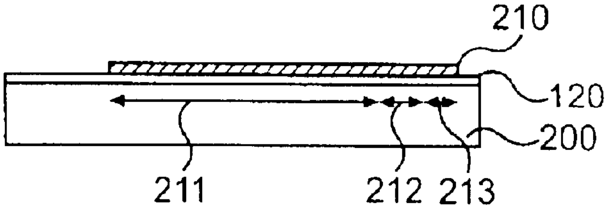
FIGS. 2(*a*), 2(*b*), 2(*c*), 2(*d*), 2(*e*), 2(*f*), and 2(*g*) are cross sectional view taken along the line A—A in FIG. 2(*h*) which show a sequence of manufacturing processes for a pressure sensor according to the second embodiment of the invention.
Figure 2B:
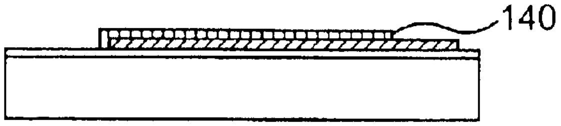
Figure 2C:
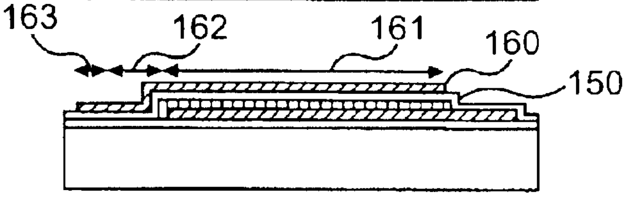
Figure 2D:
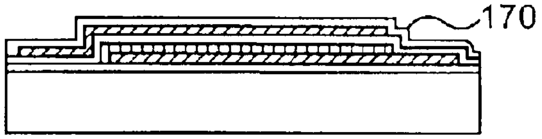
Figure 2E:
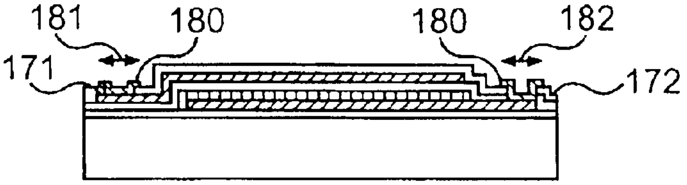
Figure 2F:
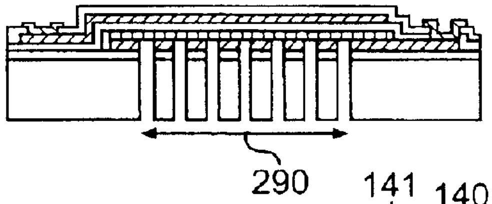
Figure 2G:
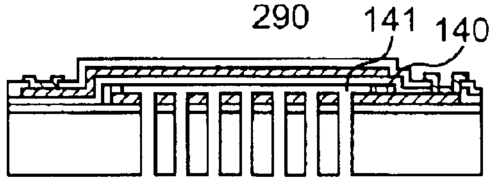
Figure 2H:
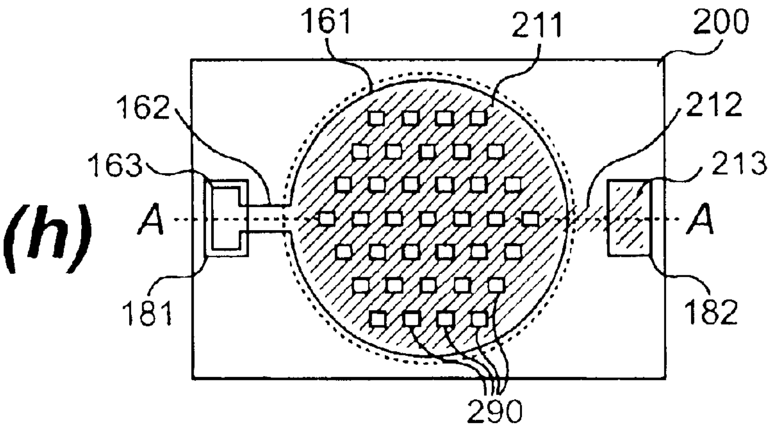

FIG. 2(*h*) shows a pressure sensor according to the second embodiment of the invention. FIGS. 2(*a*) to 2(*g*) show a sequence of manufacturing processes.

The pressure sensor of this embodiment is different from that of the first embodiment in that the first conductive layer 210 is formed by depositing a conductive material on the first insulating layer 120 formed on the whole of an upper surface of the substrate 200, and a plurality of through holes 290 are formed in the bottom of the substrate 200.

The pressure sensor includes the substrate 200 made of a monocrystalline silicon material, the cavity 141, the first insulating layer 120, the first conductive layer 210 made of metal having a higher electric conductivity, the fixed electrode 211 formed with a portion of the first conductive layer 210 on a flat area within the cavity 141, the moving electrode 161 formed with a portion of the second conductive layer 160 on a flat area of the first diaphragm layer 150 on the cavity 141, the through holes 290 vertically extending into the cavity 141, and the sacrificial layer 140.

The diaphragm consists of the first diaphragm layer 150 made of an insulating material, the second conductive layer 160, and the second diaphragm layer 170 made of an insulating material.

The fixed electrode 111 leads to the fixed electrode output terminal 182 formed with a portion of the third conductive layer 180 through the fixed electrode lead 212, the lower fixed electrode terminal 213 both formed with portions of the first conductive layer 210, and the fixed electrode connecting hole 172. The moving electrode 161 leads to the moving electrode output terminal 181 formed with a portion of the third conductive layer 180 through the moving electrode lead 162 formed with a portion of the second conductive layer 160, the lower moving electrode terminal 163, and the moving electrode connecting hole 171.

In manufacturing the pressure sensor, the first insulating layer, as shown in FIG. 2(*a*), is made of silicon oxide on an upper surface of the substrate 200. Next, a conductive material is deposited on the first insulating layer 120 to form the fixed electrode 211, the fixed electrode lead 212, and the lower fixed electrode terminal 213.

An organic layer made of, for example, polyimide is, as shown in FIG. 2(*b*), formed over the whole of the upper surface of the substrate 200, after which the periphery of the organic layer is removed to form the circular sacrificial layer 140.

The first diaphragm layer 150 made of silicon nitride is, as shown in FIG. 2(*c*), formed over the upper surface of the substrate 100. The second conductive layer 160 made of chrome is formed on the first diaphragm layer 150. Preselected portions of the second conductive layer 160 are removed to form the moving electrode 161, the lower moving electrode terminal 163, and the moving electrode lead 162 connecting the moving electrode 161 with the lower moving electrode terminal 163.

Subsequently, the second diaphragm layer 170 made of silicon nitride is, as shown in FIG. 2(*d*), formed over the upper surface of the substrate 200.

Holes are, as shown in FIG. 2(*e*), formed which extend to the lower fixed electrode terminal 213 and the lower moving electrode terminal 163 through the second diaphragm layer 170, respectively. The third conductive layer 180 is formed over the second diaphragm layer 170, after which preselected portions of the third conductive layer 180 are removed to form the moving electrode output terminal 181 and the fixed electrode output terminal 182. The moving electrode output terminal 181 connects with the lower moving electrode terminal 163 through the moving electrode connecting hole 171. The fixed electrode output terminal 182 connects with the lower fixed electrode terminal 213 through the fixed electrode connecting hole 172.

A plurality of through holes 290 are, as shown in FIG. 2(*f*), formed in the bottom of the substrate 200 at regular intervals away from each other which extend vertically, as viewed in the drawing, into the sacrificial layer 140 through the first insulating layer 120 and the first conductive layer 210. The formation of each of the holes 290 is accomplished by removing the silicon of the substrate 200 using gases whose main component is sulfur hexafluoride ($SF_6$) excited by plasma, after which the silicon oxide of the first insulating layer 120 is removed using chemical liquid such as hydrofluoric acid, and the material of the first conductive layer is etched.

The sacrificial layer 140 is removed, as shown in FIG. 2(*g*), in dry etching isotropically by injecting gasses whose main component is oxygen excited by plasma into the holes 290, thereby forming the cavity 141 between the first conductive layer 210 and the first diaphragm layer 150. The periphery of the sacrificial layer 140 is, as clearly shown in the drawing, left by controlling the etching time in order to increase the mechanical strength of a circumferential portion of the diaphragm.

The materials and forming methods used in the above processes are substantially the same as those in the first embodiment. Specifically, the first insulating layer 120 is formed in thermal oxidization or using a plasma CVD device at low temperature. The first conductive layer 210 is, like the second conductive layer 160 and the third conductive layer 180, formed by forming a metallic layer made of chrome or aluminum using evaporation or sputtering techniques and removing unmasked portions using etching reagent.

The sacrificial layer 140 is made of an organic material which is easy to remove in dry etching and which withstands the ambient temperature in the subsequent processes of forming the first and second diaphragm layers 150 and 170 (e.g., plasma CVD processes).

The vertical formation of each of the through holes 290 in the substrate 200 is, as described above, accomplished in the dry etching using gasses whose main component is sulfur hexafluoride ($SF_6$) excited by plasma and a metallic mask or a silicon oxide mask. The removal of the sacrificial layer 140 advances isotropically or radially from a portion of the sacrificial layer 140 to which oxygen radicals contained in the oxygen plasma are applied through one of the holes 290. Speeding up this process requires increase in density of the through holes 290 per unit area. It is, thus, advisable that adjacent two of all of the through holes 290 be arranged at a regular interval away from each other. The through holes 290 may alternatively be formed in a square matrix arrangement.

Usually, gas (e.g., gas to be measured or inert gas used in a case where the pressure sensor is employed in measuring a pressure difference) with which the cavity 141 is filled produces a viscous drag which may result in undesirable delay in movement of the diaphragm, however, the viscous drag may be controlled by changing the number of the through holes 290. The structure of the pressure sensor of this embodiment, thus, increases freedom in regulating a vibratory characteristic of the diaphragm.

The measurements of the pressure sensor in the second embodiment are as follows. The diameter and thickness of the cavity 141 are 1800 $\mu$m and 5 $\mu$m, respectively. The diameter and number of the through holes 290 are 100 $\mu$m and 50, respectively. The thickness of the diaphragm consisting of the first and the second diaphragm layers 150 and 170 and the second conductive layer 160 is 2 $\mu$m.

The operation of the pressure sensor of this embodiment is the same as that in the first embodiment, and explanation thereof in detail will be omitted here.

The second diaphragm layer 170 is, as described above, made of an insulating material, but may alternatively be made of a conductive material to have the same functions as those of the second conductive layer 160 and the third conductive layer 180. In this case, it is necessary to insulate the moving electrode output terminal 181 electrically from the fixed electrode output terminal 182.

The holes 290 are so formed as to penetrate through the first insulating layer 120 and the first conductive layer 210 in the process shown in FIG. 2(*f*), but such penetration may be made at the same time as the first insulating layer 120 and the first conductive layer 210 are formed in the process in FIG. 2(*a*).

The substrate 200 is made of silicon, but may alternatively be made of any other materials which allow the through holes 290 to be formed vertically because it has no diffused layer unlike the first embodiment.

Figure 3A:
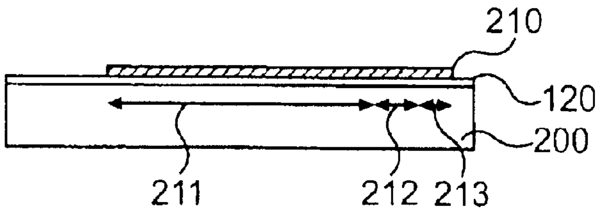
FIGS. 3(*a*), 3(*b*), 3(*c*), 3(*d*), 3(*e*), 3(*f*), and 3(*g*) are cross sectional view taken along the line A—A in FIG. 3(*h*) which show a sequence of manufacturing processes for a pressure sensor according to the third embodiment of the invention.
Figure 3B:
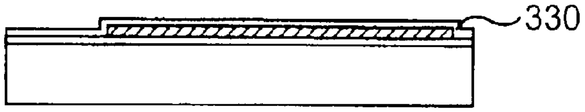
Figure 3C:
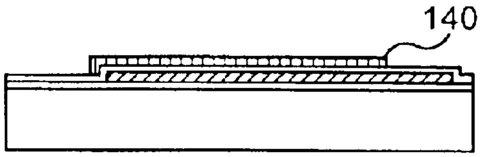
Figure 3D:
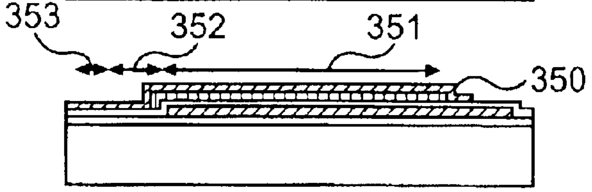
Figure 3E:
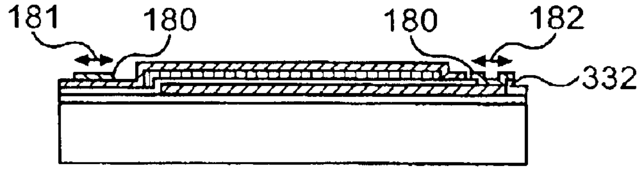
Figure 3F:
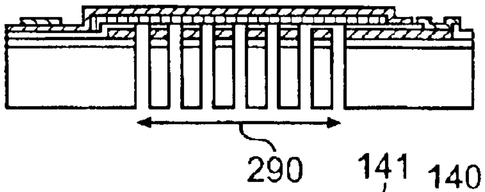
Figure 3G:
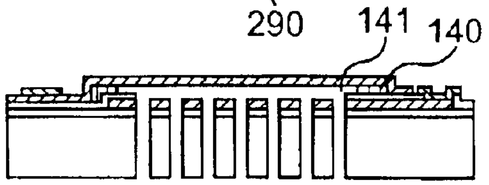
Figure 3H:
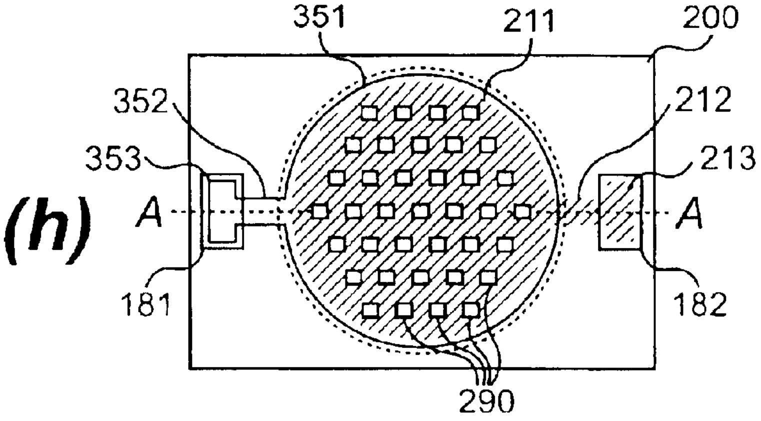

FIG. 3(*h*) shows a pressure sensor according to the third embodiment of the present invention. FIGS. 3(*a*) to 3(*g*) show a sequence of manufacturing processes.

The pressure sensor of this embodiment is different from that of the second embodiment only in that the second insulating layer 330 is formed on the first conductive layer 210, and a diaphragm consists only of the first diaphragm layer 350 made of a conductive material.

The pressure sensor includes the substrate 200 made of a monocrystalline silicon material, the cavity 141, the first insulating layer 120 formed on an upper surface of the substrate 200, the first conductive layer 210 made of metal having a higher electric conductivity, the second insulating layer 330, the fixed electrode 211 formed with a portion of the first conductive layer 210 within the cavity 141, the first diaphragm layer 350, the moving electrode 351 formed with a portion of the first diaphragm layer 350 above the cavity 141, the through holes 290 vertically extending into the cavity 141, and the sacrificial layer 140.

The fixed electrode 211 leads to the fixed electrode output terminal 182 formed with a portion of the third conductive layer 180 through the fixed electrode lead 212, the lower fixed electrode terminal 213 both formed with portions of the first conductive layer 210, and the fixed electrode connecting hole 332. The moving electrode 351 leads to the moving electrode output terminal 181 formed with a portion of the third conductive layer 180 through the moving electrode lead 352 and the lower moving electrode terminal 353 both formed with portions of the first diaphragm layer 350.

In manufacturing the pressure sensor, the first insulating layer, as shown in FIG. 3(*a*), is first made of silicon oxide on the upper surface of the substrate 200. Next, a conductive material is deposited on the first insulating layer 120 to form the fixed electrode 211, the fixed electrode lead 212, and the lower fixed electrode terminal 213.

The second insulating layer 330 is, as shown in FIG. 3(*b*), made of silicon oxide over the upper surface of the substrate 200.

An organic layer made of, for example, polyimide is, as shown in FIG. 3(*c*), formed over the whole of an upper surface of the second insulating layer 330, after which the periphery of the organic layer is removed to form the circular sacrificial layer 140.

The first diaphragm layer 350 is, as shown in FIG. 3(*d*), made of an aluminum alloy over the sacrificial layer 140, after which preselected portions of the first diaphragm layer 350 are removed to form the moving electrode 351, the lower moving electrode terminal 353, and the moving electrode lead 352 connecting the moving electrode 351 with the lower moving electrode terminal 353.

An opening is, as shown in FIG. 3(*e*), formed which leads to the lower fixed electrode terminal 213 through the second insulating layer 330. The third conductive layer 180 is formed over the whole of the upper surface of the substrate 200, after which preselected portions of the third conductive layer 180 are removed to form the moving electrode output terminal 181 and the fixed electrode output terminal 182 over the opening.

A plurality of through holes 290 are, as shown in FIG. 3(*f*), formed in the bottom of the substrate 200 which extend vertically, as viewed in the drawing, into the sacrificial layer 140 through the first insulating layer 120, the first conductive layer 210, and the second insulating layer 330. The formation of each of the holes 290 is accomplished by removing the silicon of the substrate 200 using gases whose main component is sulfur hexafluoride ($SF_6$) excited by plasma, after which the silicon oxide of the first insulating layer 120 is removed using chemical liquid such as hydrofluoric acid, the first conductive layer 210 is removed using a suitable etching liquid, and the silicon oxide of the second insulating layer 330 is removed using chemical liquid such as hydrofluoric acid.

The sacrificial layer 140 is removed, as shown in FIG. 3(*g*), in dry etching isotropically by injecting gasses whose main component is oxygen excited by plasma into the holes 290, thereby forming the cavity 141 between the second insulating layer 330 and the first diaphragm layer 350. The periphery of the sacrificial layer 140 is, as clearly shown in the drawing, left by controlling the etching time in order to increase the mechanical strength of a circumferential portion (i.e., a vertical portion) of the diaphragm.

The materials and forming methods used in the above processes are substantially the same as those in the above second embodiment, and explanation thereof in detail will be omitted here.

The measurements and operation of the pressure sensor in this embodiment are identical with those in the second embodiment, and explanation thereof in detail will be omitted here.

The second insulating layer 330 is formed on the first conductive layer 210, but may alternatively be disposed directly below the first diaphragm layer 350. In this case, after the sacrificial layer 140 is formed, an insulating layer is deposited, and then the first diaphragm layer 350 is formed. The insulating layer may be provided as the second diaphragm layer to form the diaphragm together with the first diaphragm layer 350.

The first diaphragm layer 350 is made of an aluminum alloy, but may be made of an impurity-diffused polycrystalline silicon material which has mechanical properties and electrical conductivity enough for the diaphragm.

The holes 290 are so formed as to penetrate through the first insulating layer 120, the first conductive layer 210, and the second insulating layer 330 in the process shown in FIG. 3(*f*), but such penetration may be made at the same time as the first insulating layer 120, the first conductive layer 210, and the second insulating layer 330 are formed in the processes in FIGS. 3(*a*) and 3(*b*).

The substrate 200 is made of silicon, but may alternatively be made of any other materials which allow the through holes 290 to be formed vertically.

Figure 4A:
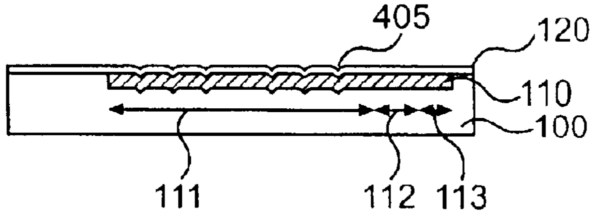
FIGS. 4(*a*), 4(*b*), 4(*c*), 4(*d*), 4(*e*), 4(*f*), and 4(*g*) are cross sectional view taken along the line A—A in FIG. 4(*h*) which show a sequence of manufacturing processes for a pressure sensor according to the fourth embodiment of the invention.
Figure 4B:
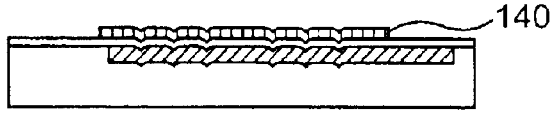
Figure 4C:
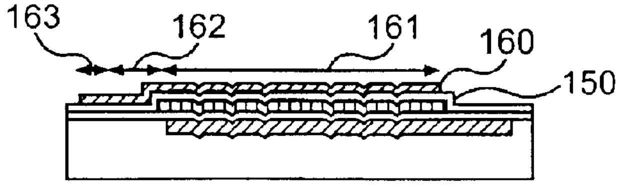
Figure 4D:
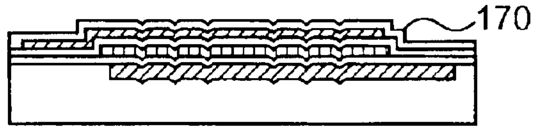
Figure 4E:
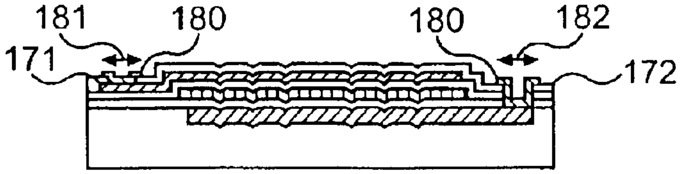
Figure 4F:
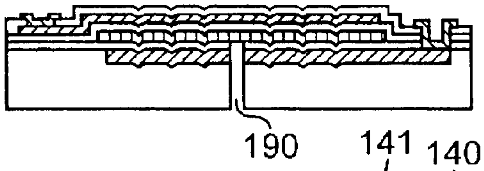
Figure 4G:
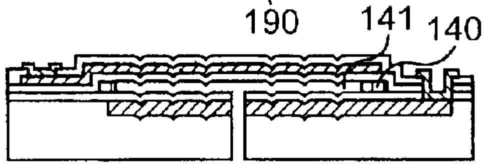
Figure 4H:
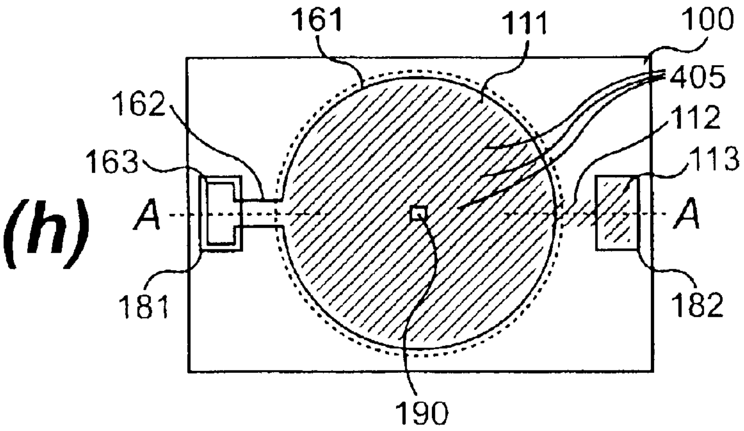

FIG. 4(*h*) shows a pressure sensor according to the fourth embodiment of the present invention. FIGS. 4(*a*) to 4(*g*) show a sequence of manufacturing processes.

The pressure sensor of this embodiment is a modification of that of the first embodiment and different therefrom only in that a portion of each layer within a range of the sacrificial layer 140 is corrugated to regulate a response characteristic of the pressure sensor to the applied pressure, and in that the periphery of the sacrificial layer 140 is left to increase the mechanical strength of the circumferential portion (i.e., a vertical portion) of a diaphragm consisting of the first and second diaphragm layers 150 and 170 and the second conductive layer 160. The other arrangements are identical, and explanation thereof in detail will be omitted here. The sacrificial layer 140 may alternatively be removed completely.

In manufacturing the pressure sensor, an upper surface of the substrate 100 is subjected to dry etching to form shallow grooves 405 coaxially in a central area on which the sacrificial layer 140 is to be disposed. The depth of the grooves 405 is, for example, several μm. The formation of the grooves 405 is achieved by covering the upper surface of the substrate 100 with a metallic mask or a silicon oxide mask and etching it using gasses containing sulfur hexafluoride ($SF_6$) excited by plasma.

Subsequent processes are substantially the same as those in the first embodiment. Specifically, impurities are diffused lightly into a preselected area of the upper surface of the substrate 100 to form, as shown in FIG. 4(*a*), the fixed electrode 111, the fixed electrode lead 112, and the lower fixed electrode terminal 113. The first insulating layer 120 made of silicon oxide is next formed on the whole of the upper surface of the substrate 100. The thickness of the first insulating layer 120 is 1 μm, so that the first insulating layer 120 is corrugated after the pattern of the grooves 450.

An organic layer made of, for example, polyimide is, as shown in FIG. 4(*b*), formed on the whole of the first insulating layer 120, after which the periphery of the organic layer is removed to form the sacrificial layer 140. During this process, the polyimide precursor that is material of the sacrificial layer 140 flows into the grooves 405 to flatten the surface of the first insulating layer 120, but it is decreased in volume to 50 to 70% by polymerization under the heat treatment, so that waves which are slightly smaller than the grooves 405 are formed on an upper surface of the sacrificial layer 140.

The first diaphragm layer 150 is, as shown in FIG. 4(*c*), made of silicon nitride over the upper surface of the substrate 100. The second conductive layer 160 is made of chrome on the first diaphragm layer 150. Preselected portions of the second conductive layer 160 are removed to form the moving electrode 161, the lower moving electrode terminal 163, and the moving electrode lead 162 connecting the moving electrode 161 with the lower moving electrode terminal 163. On the first diaphragm layer 150 and the second conductive layer 160, waves are formed after the pattern of the waves formed on the surface of the sacrificial layer 140.

Subsequently, the second diaphragm layer 170 is, as shown in FIG. 4(*d*), made of silicon nitride over the upper surface of the substrate 100. Waves which contour the waves formed in the second conductive layer 160 are formed on the surface of the second diaphragm layer 170.

Openings are, as shown in FIG. 4(*e*), formed which lead to the lower fixed electrode terminal 113 and the lower moving electrode terminal 163 through the second diaphragm layer 170, respectively. The third conductive layer 180 is formed over the second diaphragm layer 170, after which preselected portions of the third conductive layer 180 are removed to form the moving electrode output terminal 181 and the fixed electrode output terminal 182.

The through hole 190 is, as shown in FIG. 4(*f*), formed in a central portion of the bottom of the substrate 100 in the same manner as that in the first embodiment.

The sacrificial layer 140 is removed, as shown in FIG. 4(*g*), in the dry etching isotropically by injecting gasses whose main component is oxygen excited by plasma into the hole 190, thereby forming the cavity 141 between the first insulating layer 120 and the first diaphragm layer 150. The periphery of the sacrificial layer 140 is left on an inner circumferential wall of the diaphragm by controlling the etching time.

The diaphragm consisting of the first and second diaphragm layers 150 and 170 and the second conductive layer 160 is, as can be seen in the drawings, corrugated after the pattern of the grooves 405 formed in the upper surface of the substrate 100. The degree of deformation, i.e., flexibility of the diaphragm that contributes to a change in capacitance of a capacitor consisting of the moving electrode 161 and the fixed electrode 111 per unit of pressure applied to the diaphragm may be regulated easily by changing the number and/or size of the grooves 405. Instead of the coaxial grooves 405, a plurality of dimples may be formed in the upper surface of the substrate 100.

Figure 5A:
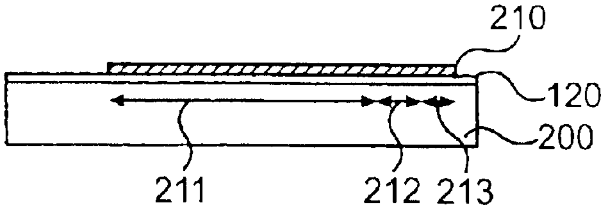
FIGS. 5(*a*), 5(*b*), 5(*c*), 5(*d*), 5(*e*), 5(*f*), and 5(*g*) are cross sectional view taken along the line A—A in FIG. 5(*h*) which show a sequence of manufacturing processes for a pressure sensor according to the fifth embodiment of the invention.
Figure 5B:
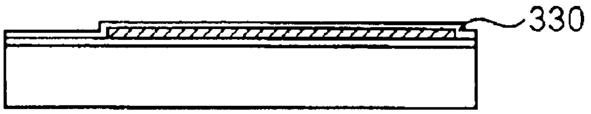
Figure 5C:
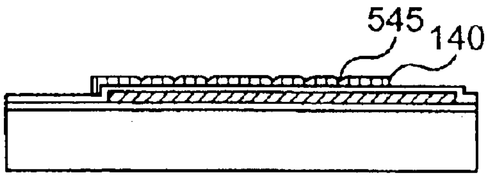
Figure 5D:
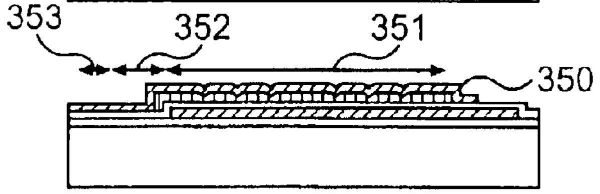
Figure 5E:
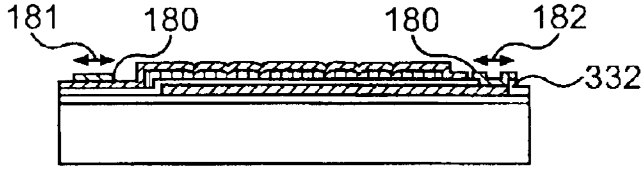
Figure 5F:
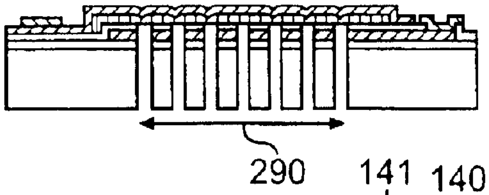
Figure 5G:
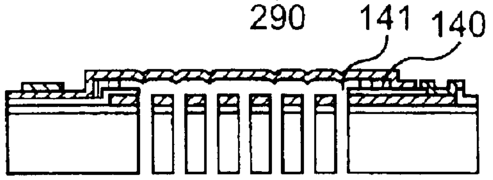
Figure 5H:
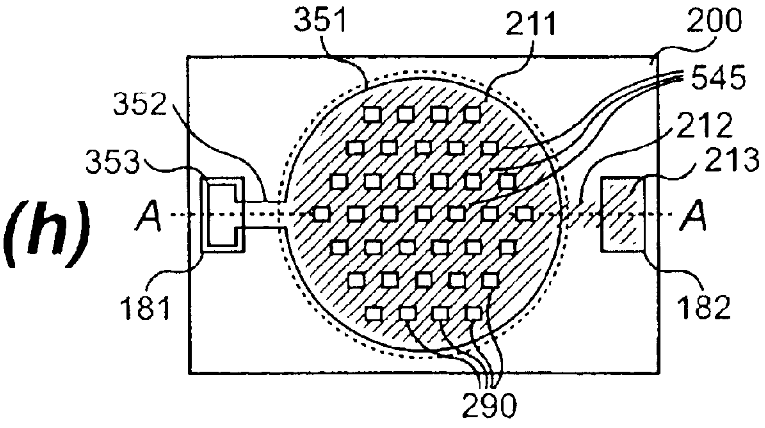

FIG. 5(*h*) shows a pressure sensor according to the fifth embodiment of the present invention. FIGS. 5(*a*) to 5(*g*) show a sequence of manufacturing processes.

The pressure sensor of this embodiment is a modification of that of the third embodiment and different therefrom in that a diaphragm is corrugated like the fourth embodiment. The others are identical, and explanation thereof in detail will be omitted here.

In manufacturing the pressure sensor, the first insulating layer, as shown in FIG. 5(*a*), is first made of silicon oxide on an upper surface of the substrate 200. Next, a conductive material is deposited on the first insulating layer 120 to form the fixed electrode 211, the fixed electrode lead 212, and the lower fixed electrode terminal 213.

The second insulating layer 330 is, as shown in FIG. 5(*b*), made of silicon oxide over the upper surface of the substrate 200.

An organic layer made of, for example, polyimide is, as shown in FIG. 5(*c*), formed over the whole of an upper surface of the second insulating layer 330, after which the periphery of the organic layer is removed to form the sacrificial layer 140. Subsequently, an upper surface of the sacrificial layer 140 is covered with a metallic mask and subjected to the dry etching or wet etching using a strong alkaline liquid to form coaxial grooves 545 having a depth of, for example, several $\mu$m.

The first diaphragm layer 350 is, as shown in FIG. 5(*d*), made of an aluminum alloy over the sacrificial layer 140, after which preselected portions of the first diaphragm layer 350 are removed to form the moving electrode 351, the lower moving electrode terminal 353, and the moving electrode lead 352 connecting the moving electrode 351 with the lower moving electrode terminal 353. The first diaphragm layer 350 is corrugated after the pattern of the grooves 545 formed in the sacrificial layer 140.

An opening is, as shown in FIG. 5(*e*), formed which leads to the lower fixed electrode terminal 213 through the second insulating layer 330. The third conductive layer 180 is formed over the whole of the upper surface of the substrate 200, after which preselected portions of the third conductive layer 180 are removed to form the moving electrode output terminal 181 and the fixed electrode output terminal 182.

A plurality of through holes 290 are, as shown in FIG. 5(*f*), formed in the bottom of the substrate 200 which extend vertically, as viewed in the drawing, and reach the sacrificial layer 140 through the first insulating layer 120, the first conductive layer 210, and the second insulating layer 330. The formation of each of the holes 290 is accomplished by removing the silicon of the substrate 200 using gases whose main component is sulfur hexafluoride ($SF_6$) excited by plasma, after which the silicon oxide of the first insulating layer 120 is removed using chemical liquid such as hydrofluoric acid, the first conductive layer 210 is removed using a suitable etching liquid, and the silicon oxide of the second insulating layer 330 is removed using chemical liquid such as hydrofluoric acid.

The sacrificial layer 140 is removed, as shown in FIG. 5(*g*), in dry etching isotropically by injecting gasses whose main component is oxygen excited by plasma into the holes 290, thereby forming the cavity 141 between the second insulating layer 330 and the first diaphragm layer 350. The periphery of the sacrificial layer 140 is, as clearly shown in the drawing, left by controlling the etching time in order to increase the mechanical strength of a circumferential portion (i.e., a vertical portion) of the diaphragm.

The formation of the grooves 545 in the sacrificial layer 140 is, as described above, achieved in the dry or wet etching, but may be made in the same manner as that used in forming the sacrificial layer 140 in the first embodiment. Instead of the grooves 545, a plurality of dimples or coaxial annular protrusions may be formed in the sacrificial layer 140. The formation of the annular protrusions may be achieved in following steps. First, a film is formed on the sacrificial layer 140 with a polyimide precursor in spin coating. Next, the solvent is dried lightly. Finally, a die in which coaxial grooves are formed is pressed against the film.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

Figure 6A:
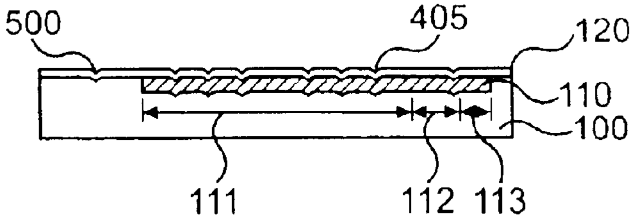
FIGS. 6(*a*), 6(*b*), 6(*c*), 6(*d*), 6(*e*), 6(*f*), and 6(*g*) are cross sectional view taken along the line A—A in FIG. 6(*h*) which show a sequence of manufacturing processes for a modification of a pressure sensor.
Figure 6B:
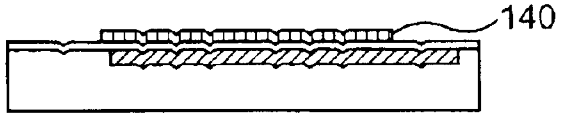
Figure 6C:
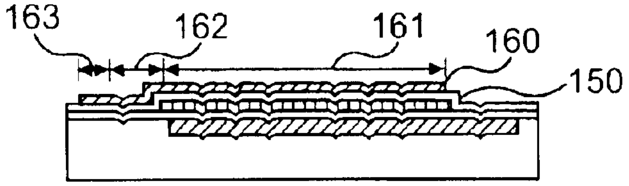
Figure 6D:
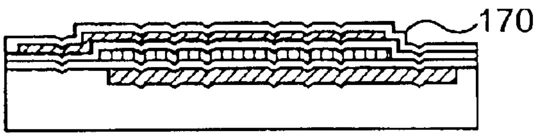
Figure 6E:
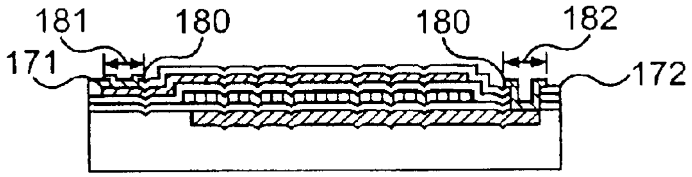
Figure 6F:
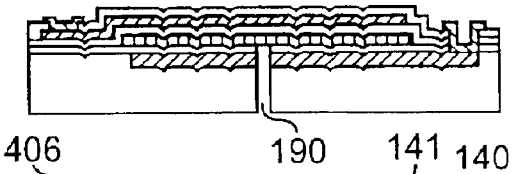
Figure 6G:
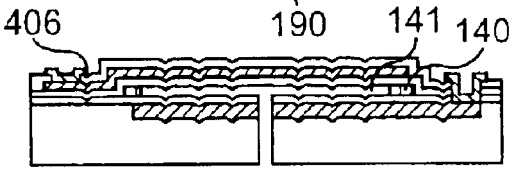
Figure 6H:
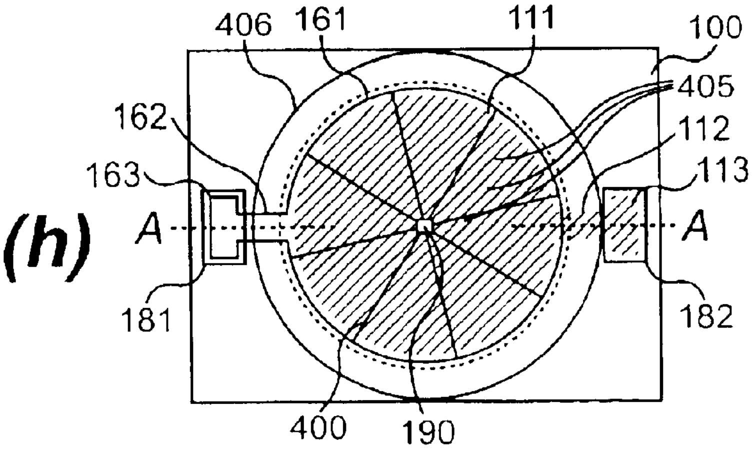
Figure 7A:
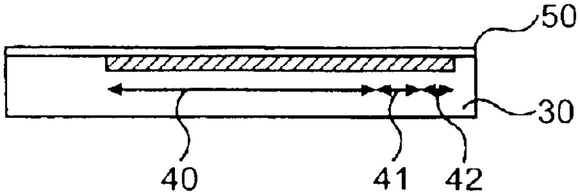
FIG. 7(a) PRIOR ART
FIGS. 7(*a*), 7(*b*), 7(*c*), 7(*d*), 7(*e*), 7(*f*), and 7(*g*) are cross sectional view taken along the line A—A in FIG. 7(*h*) which show a sequence of manufacturing processes for a conventional pressure sensor.
Figure 7B:
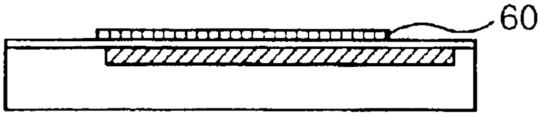
FIG. 7(b) PRIOR ART
Figure 7C:
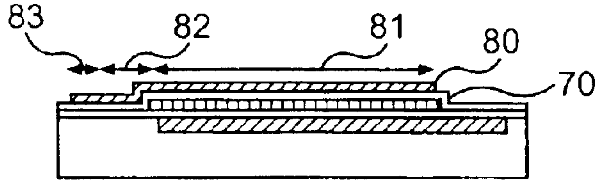
FIG. 7(c) PRIOR ART
Figure 7D:
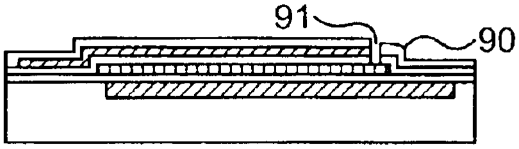
FIG. 7(d) PRIOR ART
Figure 7E:
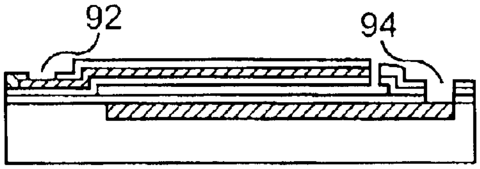
FIG. 7(e) PRIOR ART
Figure 7F:
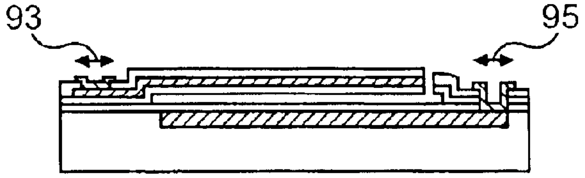
FIG. 7(f) PRIOR ART
Figure 7G:
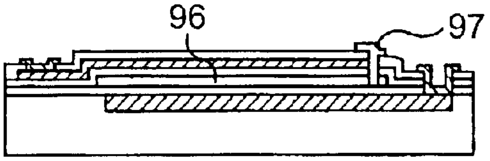
FIG. 7(g) PRIOR ART
Figure 7H:
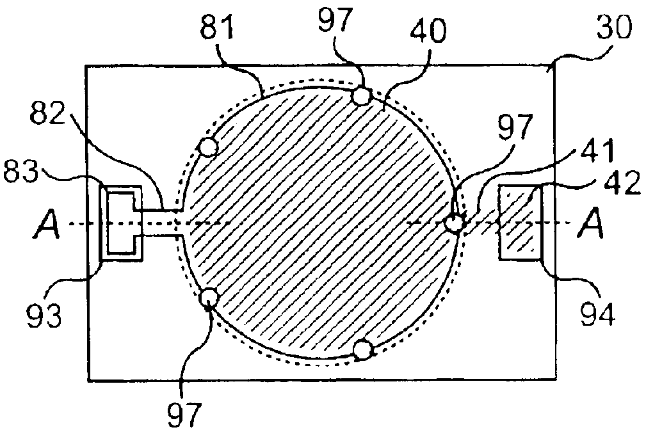
FIG. 7(h) PRIOR ART

In the first to fifth embodiments, a groove(s) may be formed in the substrate 100 or 200 which extends radially to the hole 190 or holes 290 within the cavity 140 in order to decrease the viscous drag of air within the cavity 140, thereby facilitating ease of flow of the air into the hole 190 or holes 290. This allows the size of the hole 190 or holes 290 or the number of the holes 290 may be decreased, thereby maximizing the area of the fixed electrode 111 or 211. For example, eight grooves 400, as shown by broken lines in FIG. 6(*h*), which extend radially within the cavity 140 to the hole 190, may be formed by forming corresponding grooves in the substrate 100 in the first process shown in FIG. 6(*a*) in the same manner as employed in forming the grooves 405 at the same time as the grooves 405 are formed. FIGS. 6(*a*) to 6(*h*) show substantially the same processes as those in FIGS. 4(*a*) to 6(*h*), and explanation thereof in detail will be omitted here. The grooves 400 may be formed in each of the first to fifth embodiment in the dry etching using gasses whose main component is sulfur hexafluoride ($SF_6$) excited by plasma and a metallic mask or a silicon oxide mask or the wet etching using a strong alkaline liquid and a silicon nitride mask. The use of the strong alkaline liquid in the wet etching will cause a (111) plane of a crystal lattice of silicon of the substrate 100 or 200 to be left. It is, thus, necessary for a (100) plane or a (110) plane to appear on the surface of the substrate 100 or 200.

Circular grooves or waves 406, as shown in FIG. 6(*g*), may be formed in all layers on the substrate 100 around the diaphragm consisting of the first and second diaphragm layers 150 and 170 and the second conductive layer 160. Each of the waves 406 projects downward, as viewed in the drawings, and bits into an adjacent one, thereby increasing the mechanical strength of a rim (i.e., peripheral portions of all the layers around the diaphragm) supporting the diaphragm on the substrate 100, which results in an increase in adhesion of the diaphragm to the surface of the substrate 100. This minimizes removable of the diaphragm caused by the shearing force acting on the periphery of the diaphragm and the surface of the substance 100 produced when the diaphragm is pressed. The formation of the waves 406 is achieved by forming a circular groove 500, as shown in FIG. 6(*a*), in the substrate 100 in the same manner as employed in forming the grooves 405 at the same time that the grooves 405 are formed. The waves 406 may also be formed in any of the first to fifth embodiments.

The substrate 100 and 200 is made of a silicon substrate having a constant impurity concentration, but a substrate on which circuit elements are integrated in advance which include a detector for measuring the capacitance between the fixed and moving electrodes may be used. This allows an area of the conductive layer used for wiring to be minimized, thereby reducing the parasitic capacity to improve the sensitivity of the detector to a change in capacitance.

An inactive insulating layer may be formed so as to cover the fixed and moving electrode for insulating them from surrounding gasses. For example, it may be disposed within the diaphragm. In this case, however, it is necessary to consider the mechanical strength of the whole of the diaphragm. The inactive insulating layer may alternatively be formed so as to cover the whole of the pressure sensor.

What is claimed is:

1. A method of manufacturing a pressure transducer comprising the steps of:

preparing a substrate having a first surface and a second surface opposed to the first surface;

forming a fixed electrode in the first surface of said substrate;

forming a sacrificial layer over said fixed electrode;

forming a diaphragm layer made of an insulating material over said sacrificial layer;

forming a hole which extends from the second surface of said substrate to said sacrificial layer;

injecting gasses into said hole to remove said sacrificial layer in dry etching to form a cavity so that said diaphragm layer is deformed in response to an applied pressure; and forming at least one waved portion on the first surface of said substrate.

2. A method of manufacturing a pressure transducer comprising the steps of:

preparing a substrate having a first surface and a second surface opposed to the first surface;

forming a fixed electrode in the first surface of said substrate;

forming a sacrificial layer over said fixed electrode;

forming a diaphragm layer made of an insulating material over said sacrificial layer;

forming a hole which extends from the second surface of said substrate to said sacrificial layer;

injecting gasses into said hole to remove said sacrificial layer in dry etching to form a cavity so that said diaphragm layer is deformed in response to an applied pressure; and forming at least one waved portion on a surface of said sacrificial layer.

3. A method as set forth in claim 1 or 2, wherein said substrate is made of a semiconductor substrate having integrated circuit elements which form a detector designed to measure a capacitance between the fixed and moving electrodes.

4. A method as set forth in claim 1 or 2, wherein said diaphragm is made of an inorganic material, and said sacrificial layer is made of an organic material.

5. A method as set forth in claim 1 or 2, wherein said diaphragm is made from a compound of silicon and one of oxygen and nitrogen.

6. A method as set forth in claim 1 or 2, wherein said sacrificial layer is made of polyimide.

7. A method as set forth in claim 1 or 2, wherein the removal of said sacrificial layer is achieved in the dry etching using oxygen plasma.

8. A method as set forth in claim 1 or 2, wherein said gas injecting step removes said sacrificial layer so as to leave a peripheral portion of said sacrificial layer.

9. A method of manufacturing a pressure transducer comprising the steps of:

preparing a substrate having a first surface and a second surface opposed to the first surface;

forming a fixed electrode in the first surface of said substrate;

forming an insulating layer over said fixed electrode;

forming a sacrificial layer on said insulating layer;

forming a diaphragm layer made of a conductive material over said sacrificial layer;

forming a hole which extends from the second surface of said substrate to said sacrificial layer; and injecting gasses into said hole to remove said sacrificial layer in dry etching to form a cavity so that said diaphragm layer is deformed in response to an applied pressure.

10. A method as set forth in claim 9, further comprising the step of forming at least one waved portion on the first surface of said substrate.

11. A method as set forth in claim 9, further comprising the step of forming at least one waved portion on a surface of said sacrificial layer.

12. A method as set forth in claim 9, wherein said substrate is made of a semiconductor substrate having integrated circuit elements which form a detector designed to measure a capacitance between the fixed and moving electrodes.

13. A method as set forth in claim 9, wherein said diaphragm is made of an inorganic material, and said sacrificial layer is made of an organic material.

14. A method as set forth in claim 9 wherein said diaphragm is made from a compound of silicon and one of oxygen and nitrogen.

15. A method as set forth in claim 9, wherein said sacrificial layer is made of polyimide.

16. A method as set forth in claim 9, wherein the removal of said sacrificial layer is achieved in the dry etching using oxygen plasma.

17. A method as set forth in claim 9, wherein said gas injecting step removes said sacrificial layer so as to leave a peripheral portion of said sacrificial layer.

* * * * *